(12) United States Patent
Yu et al.

(10) Patent No.: US 7,292,478 B2
(45) Date of Patent: Nov. 6, 2007

(54) NON-VOLATILE MEMORY INCLUDING CHARGE-TRAPPING LAYER, AND OPERATION AND FABRICATION OF THE SAME

(75) Inventors: Chao-Lun Yu, Hsinchu (TW); Chao-I Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 34 days.

(21) Appl. No.: 11/222,708

(22) Filed: Sep. 8, 2005

(65) Prior Publication Data

US 2007/0063268 A1    Mar. 22, 2007

(51) Int. Cl.
*G11C 16/04* (2006.01)

(52) U.S. Cl. ............... 365/185.28; 365/185.18; 365/185.29

(58) Field of Classification Search ........... 365/185.18, 365/185.28, 185.29
See application file for complete search history.

(56) References Cited

U.S. PATENT DOCUMENTS

| 6,844,584 B2* | 1/2005 | Palm et al. ............ 257/315 |
| 6,867,455 B2* | 3/2005 | Itoh et al. ............. 257/330 |
| 7,170,785 B2* | 1/2007 | Yeh ................... 365/185.17 |
| 2007/0031999 A1* | 2/2007 | Ho et al. ............... 438/142 |

OTHER PUBLICATIONS

"UMEM: A U-shape Non-Volatile-Memory Cell" By Josef Willer et al. / IEEE NVSM 2003 / pp. 42-43.
"NROM: A Novel Localized Trapping, 2-Bit nonvolatile Memory Cell" By Boaz Eitan et al. / IEEE Electron Device Letter, vol. 21, No. 11, Nov. 2000 / pp. 543-545.

* cited by examiner

*Primary Examiner*—Hoai V. Ho
(74) *Attorney, Agent, or Firm*—J.C. Patents

(57) ABSTRACT

A non-volatile memory cell is described, including a semiconductor substrate with a trench therein, a charge-trapping layer in the trench, a gate disposed in the trench and separated from the substrate by at least the charge-trapping layer, and S/D regions in the substrate beside the trench. The gate includes a p-doped semiconductor material, so that the memory cell is particularly suitable to erase through hole injection from the gate.

3 Claims, 5 Drawing Sheets

NON-VOLATILE MEMORY INCLUDING CHARGE-TRAPPING LAYER, AND OPERATION AND FABRICATION OF THE SAME

BACKGROUND OF THE INVENTION

1. Field of the Invention

The present invention relates to a non-volatile memory. More particularly, the present invention relates to a non-volatile memory structure including a charge-trapping layer, and to an operating method and a fabricating method of the same.

2. Description of the Related Art

Recently, trapping-type non-volatile memory was discussed widely for allowing a simplified fabricating process and possibly having more than one data storage sites per cell. For example, Eitan et al. (*IEEE EDL* 2000, Vol. 21, No. 11, pages 543-545) described a localized trapping 2-bit non-volatile memory cell, which has a MOS-type structure with an n-doped gate and an ONO composite layer between the substrate and the gate, wherein the nitride layer serves as a charge-trapping layer. However, since the channel length of the memory cell is short, serious punch-through leakage and second-bit effect are caused.

Moreover, the article in *IEEE NVSM* 2003 (pages 42-43) discloses a U-shaped non-volatile memory cell that also has an n-doped gate and an ONO composite layer, wherein the channel length is increased by the trench so that the short channel issues are overcome. The article also teaches to erase the memory cell through band-to-band hot hole tunneling (BTBHHT) from the substrate to the nitride trapping layer. However, BTBHHT from the substrate might cause tunnel oxide damage and result charge loss.

SUMMARY OF THE INVENTION

In view of the foregoing, this invention provides a non-volatile memory cell, which is particularly suitable to erase through hole injection from the gate.

This invention also provides a method for operating a non-volatile memory cell, which is applied to the non-volatile memory cell of this invention.

This invention further provides a method for fabricating a non-volatile memory array, which is used to fabricating a memory array that includes multiple non-volatile memory cells of this invention.

The non-volatile memory cell of this invention includes a semiconductor substrate with a trench therein, a charge-trapping layer in the trench, a gate disposed in the trench and separated from the substrate by at least the charge-trapping layer, and source/drain (S/D) regions in the substrate beside the trench. Particularly, the gate includes a p-doped semiconductor material, such as p-doped poly-Si.

In the method for operating a non-volatile memory cell of this invention, the memory cell is written through channel hot electron injection (CHEI) or Fowler-Nordheim (FN) tunneling from the substrate to the charge-trapping layer, and is erased through hole injection from the gate to the charge-trapping layer.

The method for fabricating a non-volatile memory array of this invention is described as follows. Multiple buried bit lines are formed in a semiconductor substrate, and multiple trenches are formed between the buried bit lines. A charge-trapping layer is formed in each trench, and then multiple word lines are formed crossing over the buried bit lines, wherein the word lines fill in the trenches and include a p-doped semiconductor material, such as p-doped poly-Si.

Since the gate of the non-volatile memory cell of this invention includes a p-doped semiconductor material, the energy barrier for hole injection from the gate is much lower as compared with a case where the gate is n-doped. Therefore, the non-volatile memory cell is particularly suitable to erase through hole injection from the gate, during which the tunnel oxide layer between the substrate and the charge-trapping layer is not damaged to cause charge loss. In addition, the gate may directly contact with the charge-trapping layer to further lower the energy barrier and erasing voltage.

It is to be understood that both the foregoing general description and the following detailed description are exemplary, and are intended to provide further explanation of the invention as claimed.

DESCRIPTION OF THE PREFERRED EMBODIMENTS

Memory Array/Cell Structure

Figure 1:
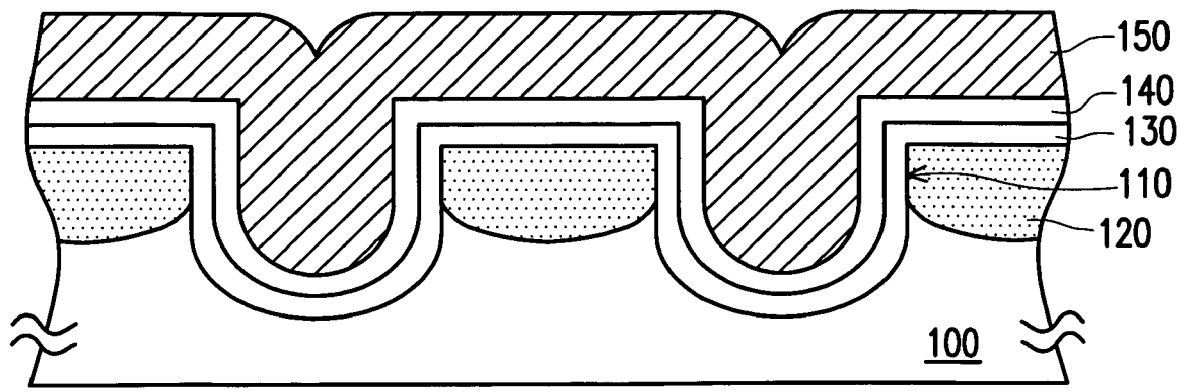
FIG. 1 illustrates a non-volatile memory according to a preferred embodiment of this invention in a cross-sectional view, wherein two memory cells are shown.
Figure 6A:
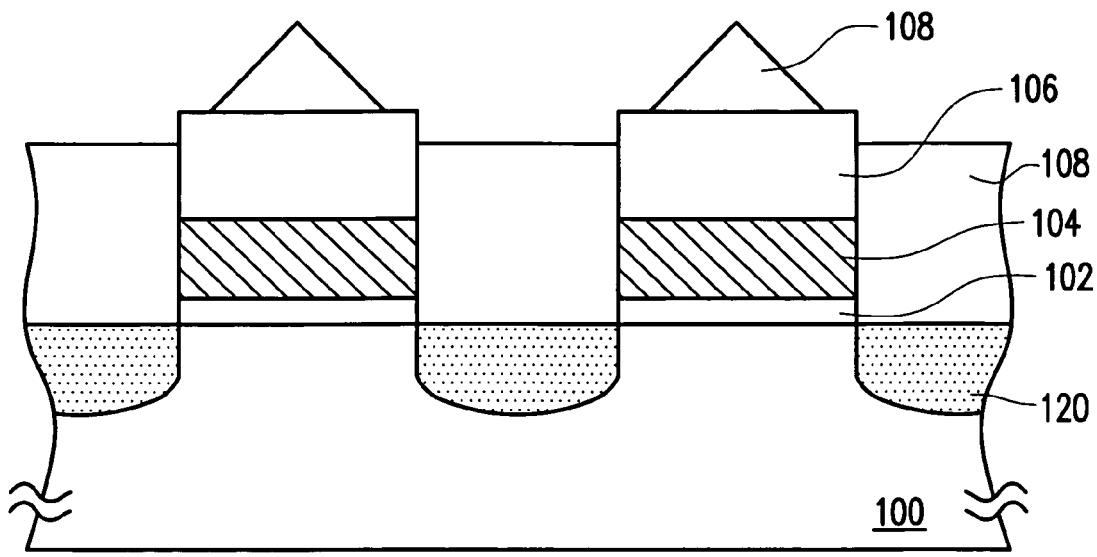
FIGS. 6A-6E illustrate a process flow of fabricating a non-volatile memory array according to the preferred embodiment of this invention in a cross-sectional view.
Figure 6B:
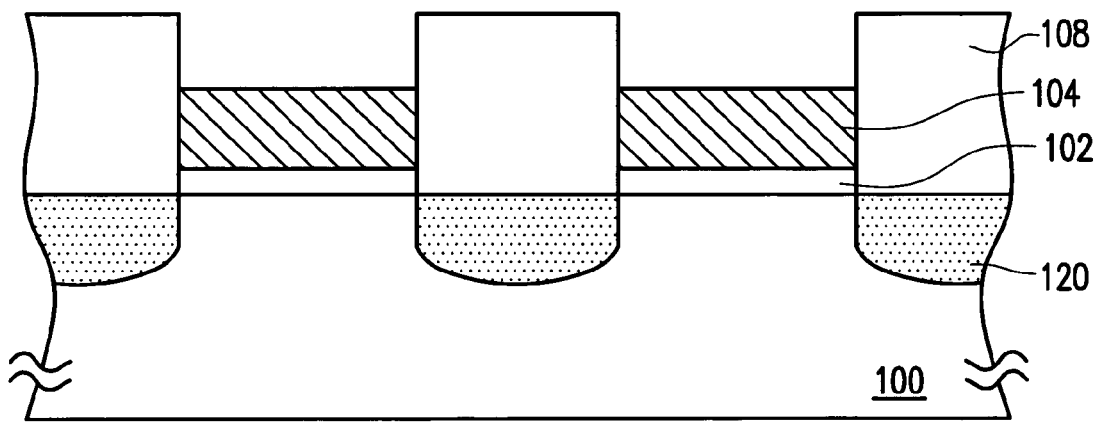
Figure 6C:
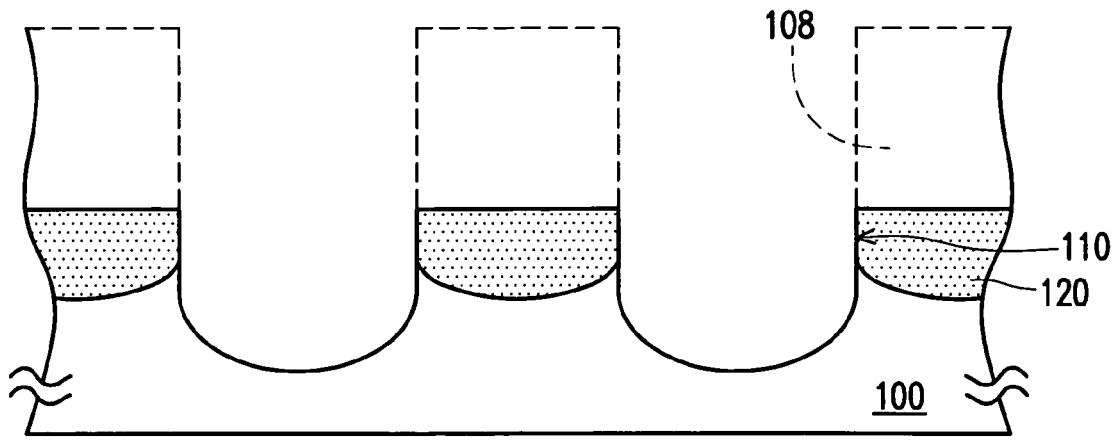
Figure 6D:
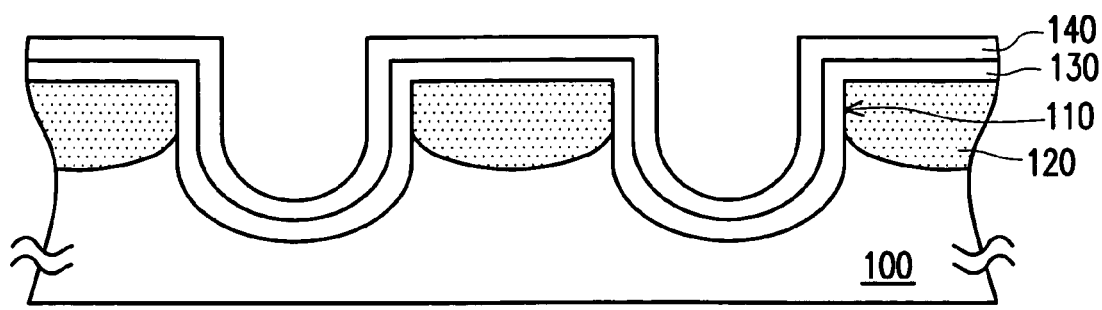
Figure 6E:
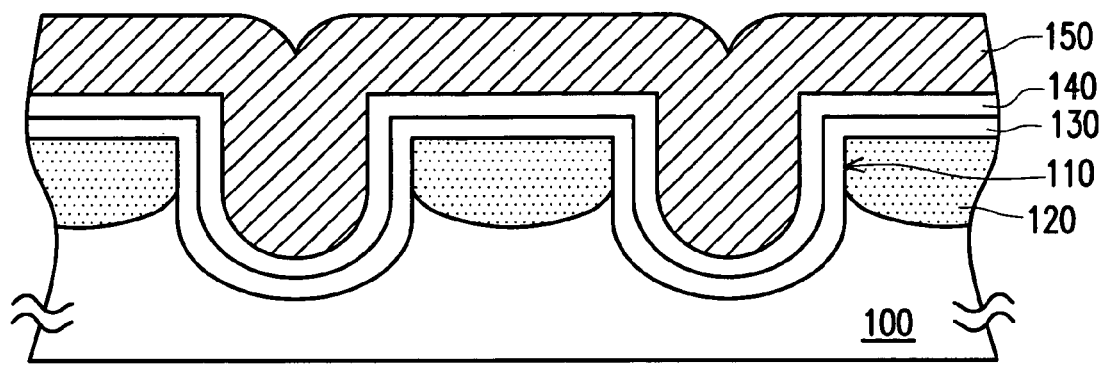
Figure 6F:
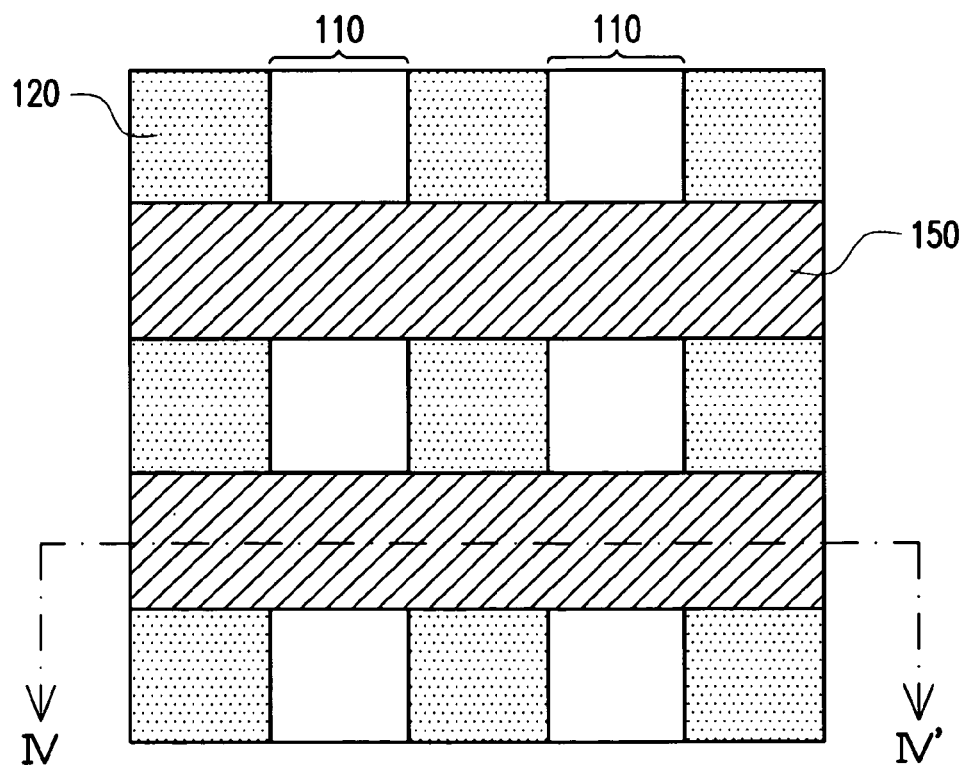
FIG. 6F illustrates a top view of the resulting structure.

FIG. 1 shows non-volatile memory array according to the preferred embodiment of this invention in a cross-sectional view, and FIG. 6F illustrates a top view of the non-volatile memory array, wherein FIG. 1 is a cross-sectional view of FIG. 6F along line IV-IV'. Referring to FIGS. 1 and 6F, the non-volatile memory array includes at least a semiconductor substrate 100 with parallel trenches 110 therein, buried bit lines 120, a charge-trapping layer 140 and multiple word lines 150.

The substrate 100 may be based on p-doped silicon, for example, and each trench 110 preferably has a rounded bottom to reduce the stress and inhibit leakage in the channel thereof. The buried bit lines 120 are located in the substrate 100 between the trenches 110, and may be formed through heavy n-doping using phosphorus ion and/or arsenic ion. The charge-trapping layer 140 is disposed on the substrate 100 and in the trenches 110, possibly including silicon nitride, $Al_2O_3$, $HfO_2$, HfAlO or $Ta_2O_5$. In addition, a tunnel oxide layer 130 is preferably disposed between the substrate 100 and the charge-trapping layer 140 to prevent leakage of the trapped charges after the programming.

The word lines 150 cross over the buried bit lines 120 and fill in the trenches 110, including a p-doped semiconductor material like p+-doped poly-Si to lower the energy barrier for hole injection therefrom. Moreover, the word lines 150 preferably directly contact with the charge-trapping layer 140, as shown in FIG. 1, so that the energy barrier for hole injection from the word lines 150 to the charge-trapping layer 140 is further lowered allowing a even lower erasing voltage to be used.

In other words, the non-volatile memory cell of this embodiment includes a semiconductor substrate 100 with a trench 110 therein, a tunnel oxide layer 130 on the substrate 100 and in the trench 110, a charge-trapping layer 140 on the tunnel oxide layer 130, a gate 150 disposed in the trench 110 and separated from the substrate 100 by the charge-trapping layer 140 and the tunnel oxide layer 130, and S/D regions 120 in the substrate 100 beside the trench 110, wherein the gate 150 includes a p-doped semiconductor material.

Operating Method of Memory Cell

Figure 2A:
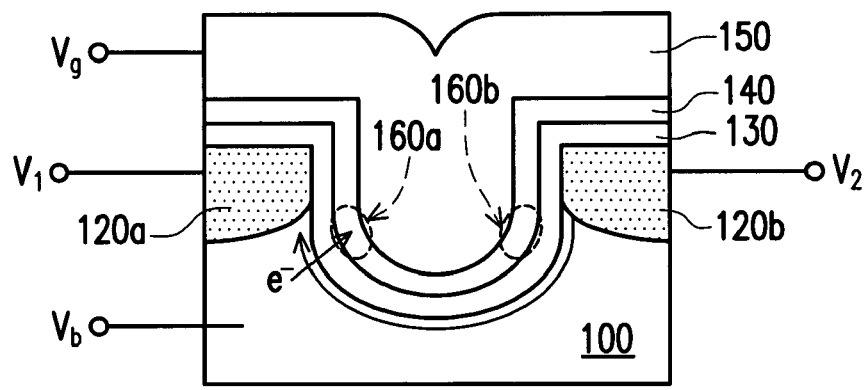
FIG. 2A/2B illustrates a step of writing an above-mentioned memory cell through CHEI/FN tunneling according to the preferred embodiment of this invention.

FIG. 2A/2B illustrates a step of writing an above-mentioned memory cell through CHEI/FN tunneling according to the preferred embodiment of this invention, wherein the memory cell stores two bits through CHEI or stores one bit through FN tunneling. Referring to FIG. 2A, when the left storage site 160a of the memory cell is to be written through CHEI, for example, the gate 150 can be applied with a positive voltage ($V_g$) of 5V to 10V, the substrate 100 can be applied with a voltage ($V_b$) of −3V to 0V, the right S/D region 120b is usually applied with 0V ($V_2$=0V), and the left S/D region 120a can be applied with a positive voltage ($V_1$) of 3V to 7V that is sufficiently to induce hot electrons in the channel near the left S/D region 120a. The hot electrons are injected into the charge-trapping layer 140 near the left S/D region 120a and trapped therein. The method of writing the right storage site 160b of the memory cell is similar to the above-mentioned, except that the values of $V_1$ and $V_2$ are interchanged.

Figure 2B:
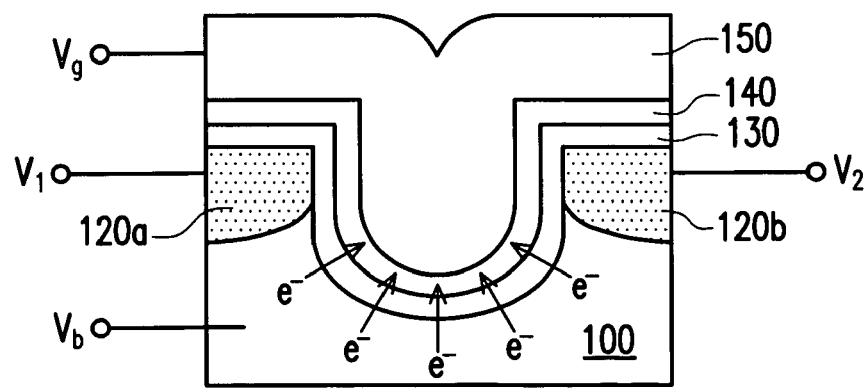

Referring to FIG. 2B, when the memory cell is to be written through FN tunneling, the gate 150 can be applied with a lower voltage ($V_g$) of −20V to 0V, the substrate 100 can be applied with a higher voltage ($V_b$) of 0V to 20V, and the S/D regions 120a and 102b are floated. The difference between $V_g$ and $V_b$ is set such that the FN tunneling effect is induced to inject electrons into the charge-trapping layer 140 from the gate 150.

Figure 3A:
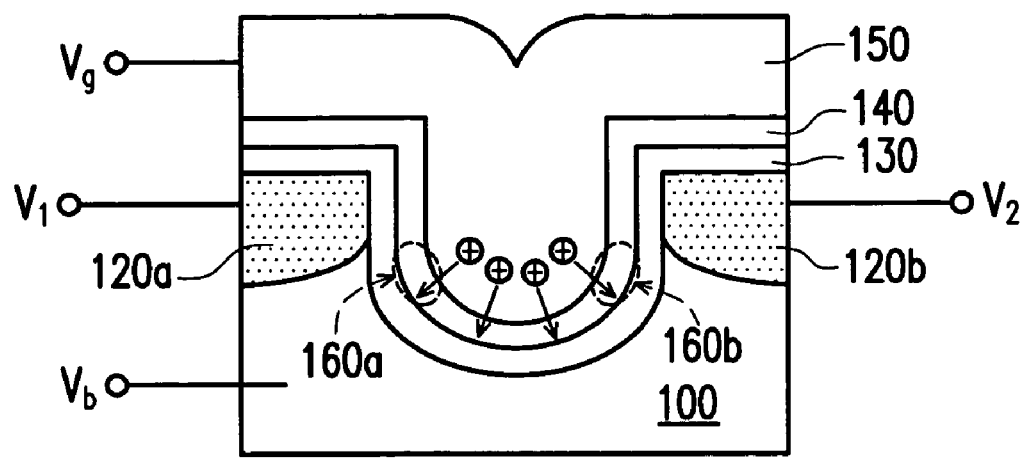
FIG. 3A/3B illustrates a step of erasing the memory cell that has been written through CHEI/FN tunneling according to the preferred embodiment of this invention.
Figure 3B:
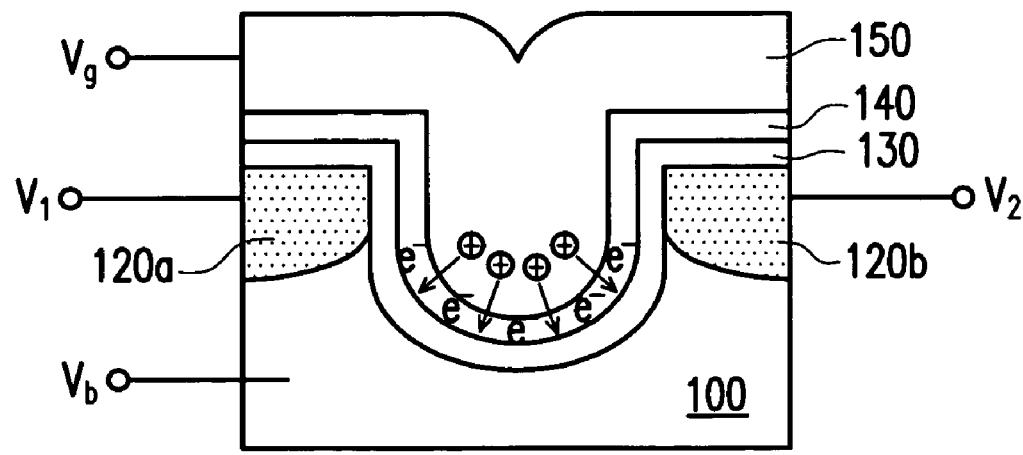

FIG. 3A/3B illustrates a step of erasing the memory cell that has been written through CHEI/FN tunneling according to the preferred embodiment of this invention. Referring to FIG. 3A/3B, when a memory cell having been written through CHEI or FN tunneling is to be erased, the gate 150 can be applied with a first voltage ($V_g$) and the substrate 100, the left S/D region 120a and the right S/D region 120b respectively with second to fourth voltages ($V_b$, $V_1$ and $V_2$), which are all lower than the first voltage such that holes can be injected into the charge-trapping layer 140 from the gate 150 to eliminate the negative charges stored therein. To facilitate the erasing operation, the second to fourth voltages are preferably set equal to each other. Accordingly, $V_g$ preferably ranges from 0V to 20V, and each of $V_b$, $V_1$ and $V_2$ preferably ranges from −20V to 0V.

It is noted that in the hole-injection erasing step after the memory cell is written with CHEI, some holes are injected into the electrically neutral part of the charge-trapping layer 140 between the two storage sites 160a and 160b, as shown in FIG. 3A. This will not affect subsequent operations of the memory cell, because the number of the holes injected into the electrically neutral part of the charge-trapping layer 140 has a certain upper limit depending on the voltage difference set in the erasing step, which does not much affect the threshold voltage of the memory cell.

Figure 5:
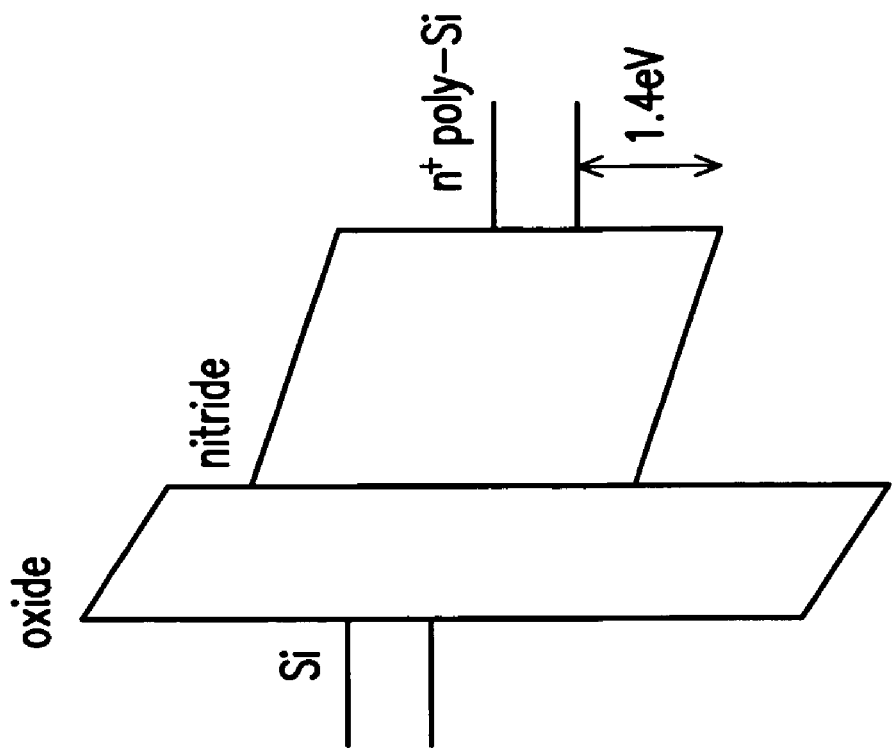
FIG. 5 illustrates an energy diagram of the stacked structure of a Si-substrate, a silicon oxide layer, a silicon nitride layer and an n$^+$-doped gate.
Figure 4:
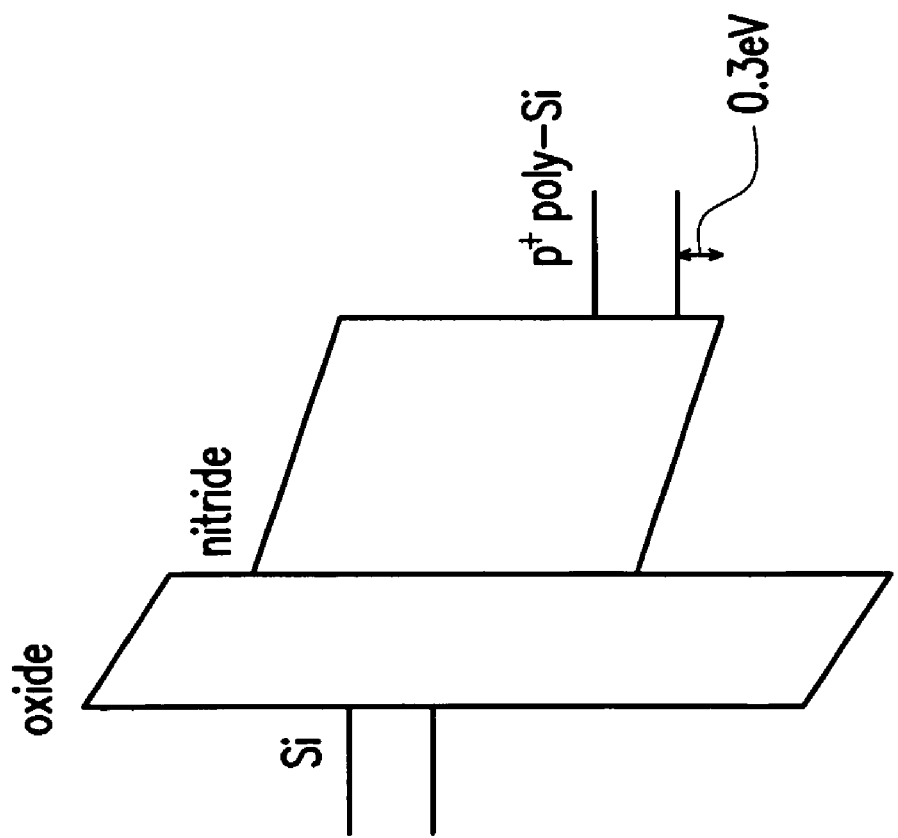
FIG. 4 illustrates an energy diagram of the stacked structure of a Si-substrate, a silicon oxide layer, a silicon nitride layer and a p$^+$-doped gate of this invention.

It is particularly noted that forming the word lines or gates 150 from a p-doped semiconductor material can lower the energy barrier for hole injection from the word lines or gates 150. FIG. 4 illustrates an energy diagram of the stacked structure of a Si-substrate, a silicon oxide layer, a silicon nitride layer and a p-doped gate according to this invention. FIG. 5 illustrates an energy diagram of the stacked structure of a Si-substrate, a silicon oxide layer, a silicon nitride layer and an n-doped gate. By comparing the two energy diagrams, it is noted that changing the conductivity type of the gate from n-type to p-type can significantly lower the energy barrier to 0.3 eV from 1.4 eV. Accordingly, the erasing voltage of the memory cell can be lowered effectively.

Fabricating Process of Memory Array

FIGS. 6A-6E illustrate a process flow of fabricating a non-volatile memory array according to the preferred embodiment of this invention in a cross-sectional view, and FIG. 6F illustrates a top view of the resulting structure.

Referring to FIG. 6A, multiple linear stacked layers, each of which includes a gate dielectric layer 102, a gate line layer 104 and a cap layer 106, are formed on semiconductor substrate 100. The linear stacked layers are previously formed together with other devices, possibly the devices in the peripheral circuits of the memory chip. Then, buried bit lines 120 are formed in the substrate 100 between the linear stacked layers through ion implantation, possibly together with an ion implantation of other devices. An HDP-CVD process, which is usually utilized for gap filling, is conducted to form an oxide layer 108 that includes portions filling in between the linear stacked layers and portions located on the tops of the linear stacked layers. The portions of the oxide layer 108 filling in between the linear stacked layers serve as a mask material for defining the trenches of the non-volatile memory array.

Referring to FIG. 6B, the cap layer 106 is removed through wet etching, in accompany with removal of the portions of the oxide layer 108 on the tops of the linear stacked layers. Referring to FIG. 6C, after the gate line layer 104 and the gate dielectric layer 102 are removed, the substrate 100 is etched, using the oxide layer 108 as a mask, to formed parallel trenches 110. The etching recipe is preferably set such that the trenches 110 have rounded bottoms, so as to reduce the stress and inhibit current leakage in the channel. Since the channel length can be increased by the trenches 110, the buried bit lines 120 can be formed much deeper than ordinary shallow S/D junctions to significantly reduce the resistance thereof. The oxide layer 108 is then removed.

Referring to FIG. 6D, a tunnel oxide layer 130 is formed on the substrate 100 and in the trenches 110, and then a charge-trapping layer 140 is formed on the tunnel oxide layer 130. The material of the charge-trapping layer 140 may be silicon nitride, $Al_2O_3$, $HfO_2$, HfAlO or $Ta_2O_5$, wherein silicon nitride or $Al_2O_3$ is usually used. The thickness of the tunnel oxide layer 130 is preferably 1-7 nm, and that of the charge-trapping layer 140 is preferably 5-25 nm.

Refer to FIGS. 6E and 6F, wherein FIG. 6E is entirely same as FIG. 1 and is a cross-sectional view of FIG. 6F along line IV-IV'. Multiple word lines 150 of p-type conductivity are then formed crossing over the buried bit lines 120 and directly contacting with the charge-trapping layer 140. Since the word lines 150 are p-doped and directly contact with the charge-trapping layer 140, the energy barrier for the hole injection from the word lines 150 gate can be much lowered.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for operating a non-volatile memory cell that comprises a substrate with a trench therein, a charge-trapping layer in the trench, a gate filling disposed in the trench and comprising a p-type semiconductor material separated from the substrate by at least the charge-trapping layer, and a first S/D region and a second S/D region in the substrate beside the trench, wherein the gate directly contacts with the charge-trapping layer and the charge-trapping layer consists of a single material, comprising:

writing the non-volatile memory cell through channel hot electron injection (CHEI) or FN tunneling from the substrate to the charge-trapping layer; and erasing the non-volatile memory cell through FN tunneling to inject holes from the gate to the charge-trapping layer.

2. The method of claim 1, wherein the step of erasing the memory cell comprises: applying a first voltage to the gate; and applying second to fourth voltages to the substrate, the first S/D region and the second S/D region, respectively, wherein the second to fourth voltages are all lower than the first voltage such that holes can be injected into the charge-trapping layer from the gate.

3. The method of claim 2, wherein the second to fourth voltages are equal to each other.

* * * * *